United States Patent
Fujisawa

(10) Patent No.: US 7,890,679 B2
(45) Date of Patent: Feb. 15, 2011

(54) DATA GENERATOR FOR GENERATING DATA OF ARBITRARY LENGTH

(75) Inventor: Yasumasa Fujisawa, Kanagawa (JP)

(73) Assignee: Tektronix, Inc., Beaverton, OR (US)

( * ) Notice: Subject to any disclaimer, the term of this patent is extended or adjusted under 35 U.S.C. 154(b) by 119 days.

(21) Appl. No.: 11/264,985

(22) Filed: Nov. 1, 2005

(65) Prior Publication Data
US 2006/0155898 A1    Jul. 13, 2006

(30) Foreign Application Priority Data
Nov. 26, 2004    (JP)    ............... 2004-342563

(51) Int. Cl.
*G06F 13/12* (2006.01)
*G06F 13/38* (2006.01)
*G01R 31/28* (2006.01)

(52) U.S. Cl. ............... 710/66; 710/62; 714/724
(58) Field of Classification Search ............... 714/724; 710/62, 66
See application file for complete search history.

(56) References Cited

U.S. PATENT DOCUMENTS

| 4,839,866 | A | * | 6/1989 | Ward et al. ............... 365/221 |
| 4,876,685 | A | * | 10/1989 | Rich ............... 714/723 |
| 4,918,446 | A | * | 4/1990 | Yagi ............... 341/94 |
| 5,388,074 | A | * | 2/1995 | Buckenmaier ............ 365/189.05 |
| 5,515,386 | A | * | 5/1996 | Takizawa et al. ............ 714/776 |
| 5,524,112 | A | * | 6/1996 | Azuma et al. ............... 370/402 |
| 6,032,275 | A | | 2/2000 | Tsuto |
| 6,087,874 | A | * | 7/2000 | Hogeboom ............... 327/270 |
| 6,356,158 | B1 | * | 3/2002 | Lesea ............... 331/11 |
| 6,463,092 | B1 | * | 10/2002 | Kim et al. ............... 375/219 |
| 6,658,523 | B2 | * | 12/2003 | Janzen et al. ............ 711/105 |
| 2002/0008558 | A1 | * | 1/2002 | Okuda et al. ............... 327/175 |
| 2002/0124219 | A1 | * | 9/2002 | Kuroki ............... 714/739 |
| 2002/0174368 | A1 | * | 11/2002 | Nishizaki ............... 713/201 |

FOREIGN PATENT DOCUMENTS

| JP | 2002-207692 | | 7/2002 |
| JP | 2002207692 A | * | 7/2002 |

* cited by examiner

*Primary Examiner*—Alford W Kindred
*Assistant Examiner*—Farley J Abad
(74) *Attorney, Agent, or Firm*—William K. Bucher

(57) ABSTRACT

A data generator provides faster data than before. A parallel data generator 18 provides first data having four or five effective data width according to a divided clock DCLK. A bit width adjuster 20 having a FIFO memory receives the first parallel data to provide second parallel data of constant four bit width despite of the bit width of the first parallel data. A parallel to serial converter 12 converts the second parallel data into serial data according to a reference clock RCLK that is faster than divided clock DCLK. The frequency of the divided clock DCLK can be constant, which makes it possible to use DLL to fasten the operation of the logic circuits.

5 Claims, 3 Drawing Sheets

DATA GENERATOR FOR GENERATING DATA OF ARBITRARY LENGTH

BACKGROUND OF THE INVENTION

The present invention relates to a data generator suitable for generating fast serial data having arbitrary data length.

There are various ways to inspect an electronic circuit to determine if the circuit is operating properly. One way is to provide a test digital data pattern to a circuit under test and to verify that the output of the circuit is as expected. In this case, a desired digital data pattern is stored in a memory and provided to a data generator which generates the corresponding data pattern signal. Another way is to provide an arbitrary analog signal to the circuit under test wherein the digital data corresponding to the analog signal is prepared in advance and an digital-to-analog converter converts the digital data into the analog signal. In these and other examples, a digital data pattern is necessary. U.S. Pat. No. 6,032,275 by Masaru, for example, discloses such data generation and measurement of a circuit under test.

FIG. 1 shows an example of a parallel data generator 10 having a memory for storing digital data patterns. A selected digital data pattern is read from the memory but the reading speed is not sufficiently fast so the data is read in parallel from the memory by a given bit width and then converted into serial data to have a desired data speed. The parallel data generator 10 provides parallel data according to a divided clock DCLK and a parallel to serial converter 12 converts the parallel data into serial data according to a reference clock RCLK. In this example, the bit width of the parallel data is four bits. The parallel to serial converter 12 receives and divides the reference clock RCLK by four to produce and provide the divided clock DCLK to the data generator 10.

In case of FIG. 1, the length of the data pattern is limited to multiples of four bits. However, it is desirable to be able to generate data patterns having arbitrary lengths. FIG. 2 shows another data generator that produces a data pattern having an arbitrary length. A parallel data generator 14 selectively provides parallel data having four or five effective bits and a bit width identifier BWI. A parallel to serial converter 16 receives the bit width identifier BWI to control the bit width in the parallel to serial conversion at one time so that it converts the parallel data of four or five bit width into serial data according to a reference clock RCLK. Wherein the frequency of the reference clock RCLK is constant but the frequency of a divided clock DCLK changes according the bit width of the first parallel data converted by the converter 16.

Phase lock loop (PLL) and/or delayed lock loop (DLL) are well known technique to realize a fast logic circuit. The DLL intentionally delays clock phase up to maximum one clock as if there were no clock delay. The frequency of the divided clock DCLK in FIG. 2 changes depending on the bit width in the parallel to serial conversion, which produces noise. Therefore, PLL or DLL cannot be used, which prevents the data generator from working fast.

SUMMARY OF THE INVENTION

A data generator according to the present invention is suitable for generating faster serial data. A parallel data generator may have memory and provides first parallel data of which effective bit width is selectively changed according to a first clock. A bit width adjuster may have a FIFO memory and receives the first parallel data to produce second parallel data that has constant bit width despite of the bit width of the first parallel data. A parallel to serial converter converts the second parallel data into serial data according to a second clock that is faster than the first clock. Note that the frequency of the first clock according to the present invention is constant even if the effective bit width changes so that it realize faster logic circuit with using delay lock loop (DLL) etc. wherein the first clock may be derived from the second clock.

The parallel data generator may provide a bit width identifying signal to the bit width adjuster to have it decide whether the first parallel data are written into it or not. In this process, if the bit width adjuster does not have enough room to receive the first parallel data, it temporally stops writing the data. As a result, it allows the parallel data generator to have the same order of the bit widths of the first parallel data every divided clock, which makes the data control easy.

The objects, advantages and other novel features of the present invention are apparent from the following detailed description when read in conjunction with the appended claims and attached drawings.

DETAILED DESCRIPTION OF THE PREFERRED EMBODIMENT

Figure 1:
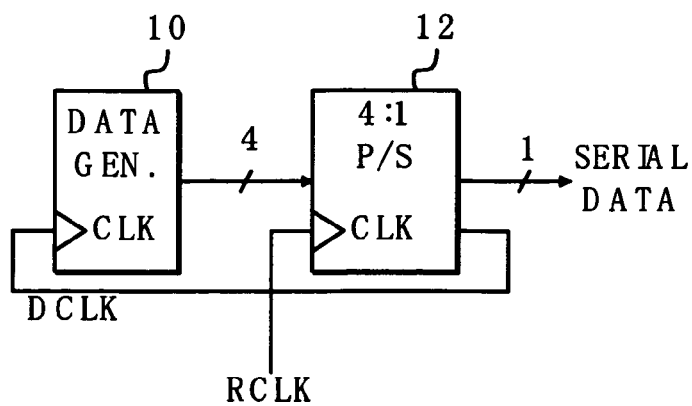
FIG. 1 is a block diagram of a conventional data generator.
Figure 2:
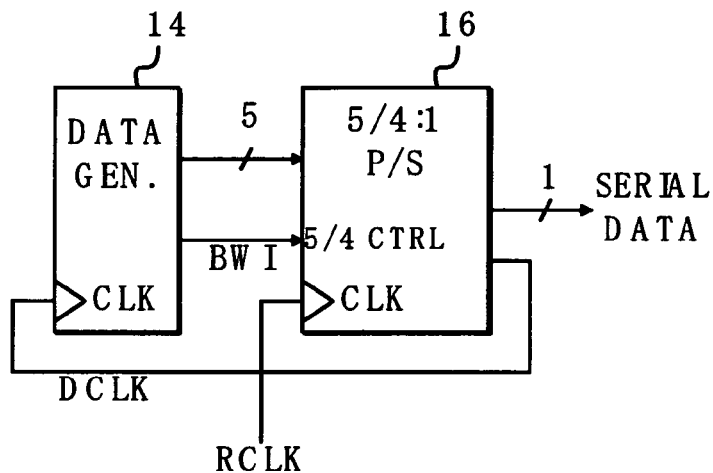
FIG. 2 is a block diagram of another conventional data generator.
Figure 3:
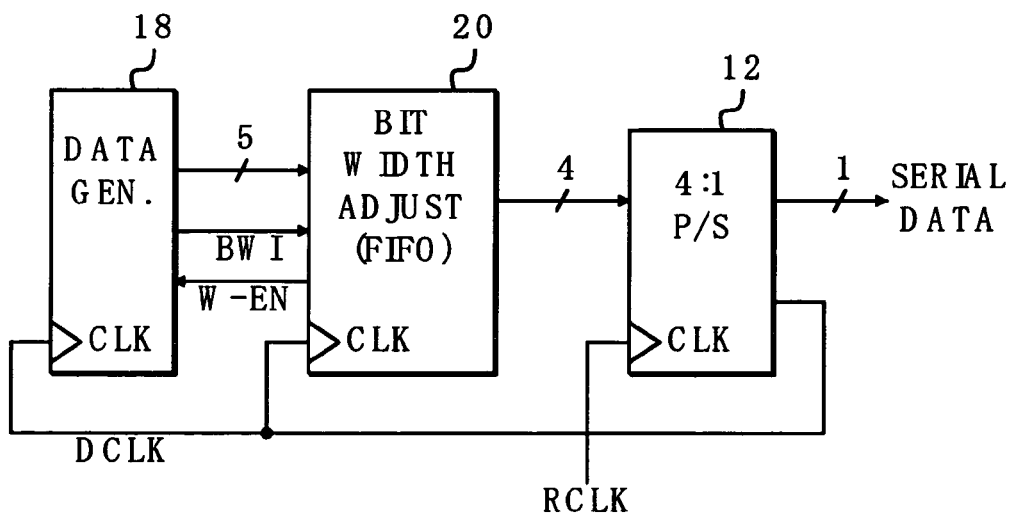
FIG. 3 is a block diagram of a preferred embodiment of a data generator according to the present invention.

FIG. 3 shows an embodiment of the present invention incorporated into a signal generator instrument, such as an arbitrary waveform generator or the like, that includes a microprocessor, RAM memory, hard disk drive (HDD), keyboard, and the like, which are not shown. The signal generator operates under program control including the data generator of the present invention using programs stored in the RAM memory or on the hard disk drive. In the following descriptions, corresponding blocks in different Figs. are indicated by the same numbers.

A parallel data generator 18 having a memory to store desired data provides first parallel data of four or five effective bit width at one time according to a divided clock DCLK. Alternately, a separate memory may store the desired data which is coupled to the parallel data generator 18. If the effective bit width is four bits, only the four bits are used even if the first parallel data has five bits. The microprocessor under program control preferably controls whether the first parallel data has four or five effective bit width. The parallel data generator 18 also provides an effective bit width identifier BWI to a bit width adjuster 20. Communications between the parallel data generator 18 and the bit width adjustor 20 is via the microprocessor where the bit width identifier BWI and a write enable signal are provided by the microprocessor.

The bit width adjuster 20 preferably has a FIFO memory for receiving the parallel data from the parallel data generator 18. The bit width adjustor 20 converts the parallel data from the parallel data generator, referred hereinafter as the first parallel data, into second parallel data which has a constant bit width of four bits by rearranging the first parallel data. The second parallel data is provided to a parallel to serial converter 12 according to a divided clock DCLK derived from a reference clock RCLK. The parallel to serial converter 12 converts the second parallel data having a bit width of four into serial data according to the received reference clock RCLK. The parallel to serial converter 12 divides the reference clock RCLK to provide the divided clock DCLK. In the embodiment of FIG. 3, the four bit parallel data is converted into serial data so that a dividing ratio of the parallel to serial converter 12 can be four and the frequency of the divided clock DCLK is constant and one fourth of that of the reference clock RCLK.

Figure 4:
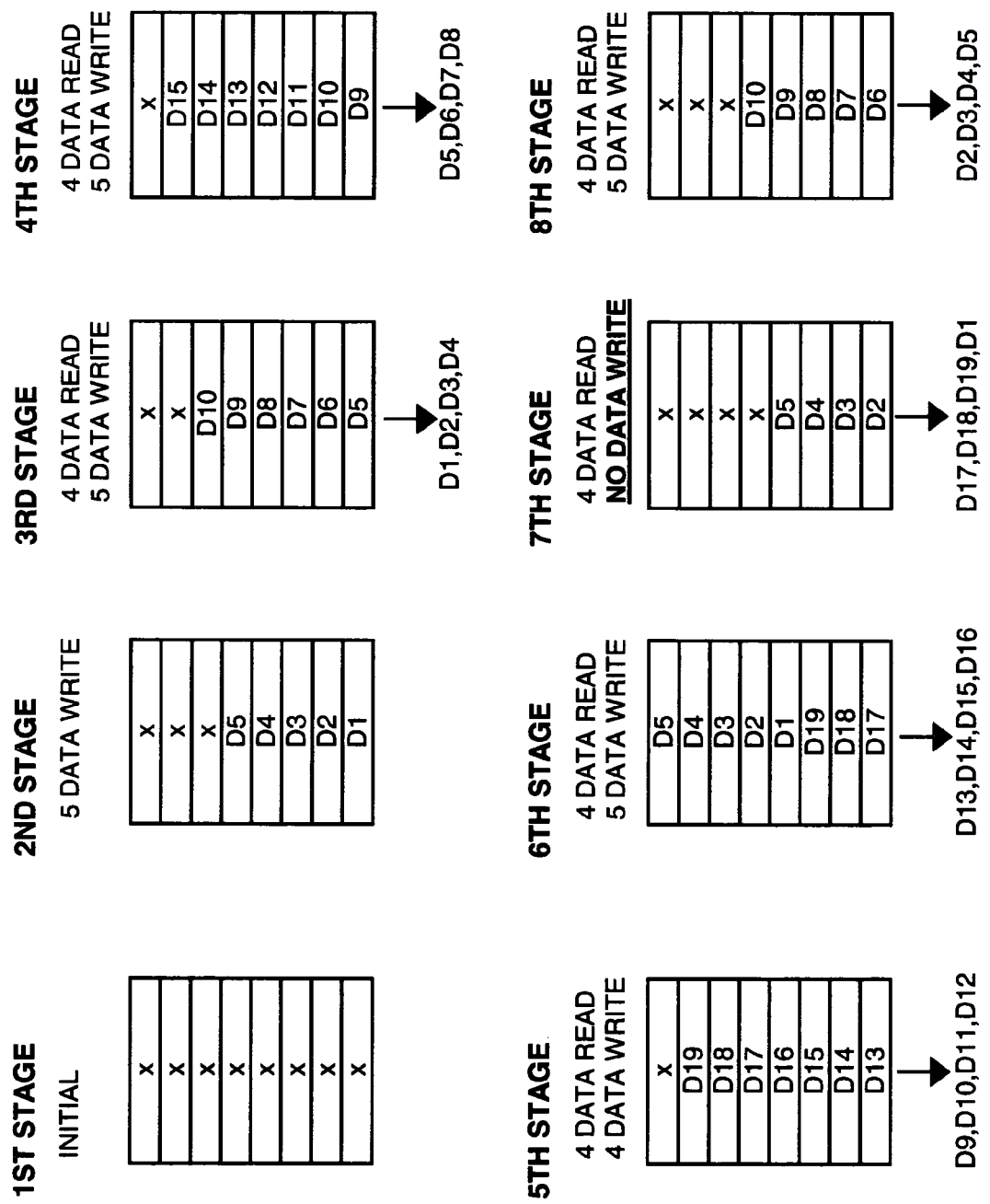
FIG. 4 shows operation chart of a bit width adjuster according to the present invention.

FIG. 4 shows operations of the bit width adjuster 20 during eight clocks (eight stages) of the divided clock DCLK. In this example, the bit width adjustor 20 receives parallel data of which one cycle is 19 bits of data and converts it into serial data. The 19 bits of data may be, for example, three sets of five bit parallel data and one set of four bit parallel data since the effective bit width of the first parallel data is five or four bits. The length of one cycle, however, is not limited to 19 bits of data but can be arbitrary number of bits by combining the bit widths of the parallel data.

In the below described operation, the bit width adjuster 20 has eight data registers and receives an effective bit width identifying signal BWI. The first stage indicates an initial state where the bit width adjuster 20 has no effective data. The bit width adjuster 20 receives the divided clock DCLK and advances to the second stage where it receives parallel data of five bits so that D1-D5 are written into the bit width adjuster 20. In third stage, four data bits D1-D4 are readout to the parallel to serial converter 12 and new five data bits D6-D10 are written into the bit width adjuster 20. As a result, there are six data bits including the remaining data bit D5 in the bit width adjuster 20. In fourth stage, four data bits D5-D8 are provided to the parallel to serial converter 12 and new five data bits D11-D15 are written into the bit width adjuster 20. In fifth stage, four data bits D9-D12 are provided to the parallel to serial converter 12 and new four (or not five) data bits D16-D19 are written into the bit width adjuster 20. As described, a total 19 data bits, the five bit width parallel data in second, third and fourth stages and the four bit width parallel data in the fifth stage, are written into the bit width adjuster 20 while the bit width of the readout parallel data is always constant, in this case four bits.

In sixth stage, four data bits D13-D16 are readout to the parallel to serial converter 12 and new five data bits D1-D5 of the second cycle are written into the bit width adjuster 20. In seventh stage, five new data bits should be written into the bit width adjuster 20. However, the are only four registers available for the five new data bits. The bit width adjuster 20 provides a write enable signal (W-EN) to the data generator 18 to prevent the writing the next first parallel data into the registers if the effective bit width of the next first parallel data is five bits thought there are only four or less available registers. In this case, there may be a choice of writing four data. But the data control would be easier to keep the same order of 5, 5, 5 and 4 every divided clock so that it stops the data write. If complex control is acceptable, the order of the write data widths may change every divided clock. Four data bits D17-D19 and D1 are provided to the parallel to serial converter 12. In eighth stage, four data bits D2-D5 are read out and five data are again written. The similar processes continue repetitively.

The data generator of the present invention has been described with a bit width adjuster 20 having an eight register FIFO memory. The number of registers in the FIFO memory is by example only and a FIFO memory having greater than eight registers is contemplated. The size of the FIFO memory preferably is two times the number of parallel bits output by the bit width adjuster 20. In the above example, the bit width adjuster 20 outputs four parallel bits so the FIFO memory has eight registers. If the bit width adjuster 20 outputs eight parallel bits, the FIFO memory would have sixteen registers. Increasing the number of parallel output bits of the bit width adjuster 20 would allow a corresponding increase in the first parallel data input to the bit width adjuster 20 from the parallel data generator 18 in the form of eight or nine parallel bits. Increasing the number of parallel data bits from the bit width adjuster 20 to the parallel to serial converter 12 from four to eight would result in a decrease in the speed of the DCLK signal since it is produced by dividing the RCLK signal by number of parallel bits output by the bit width adjuster 20.

Figure 5:
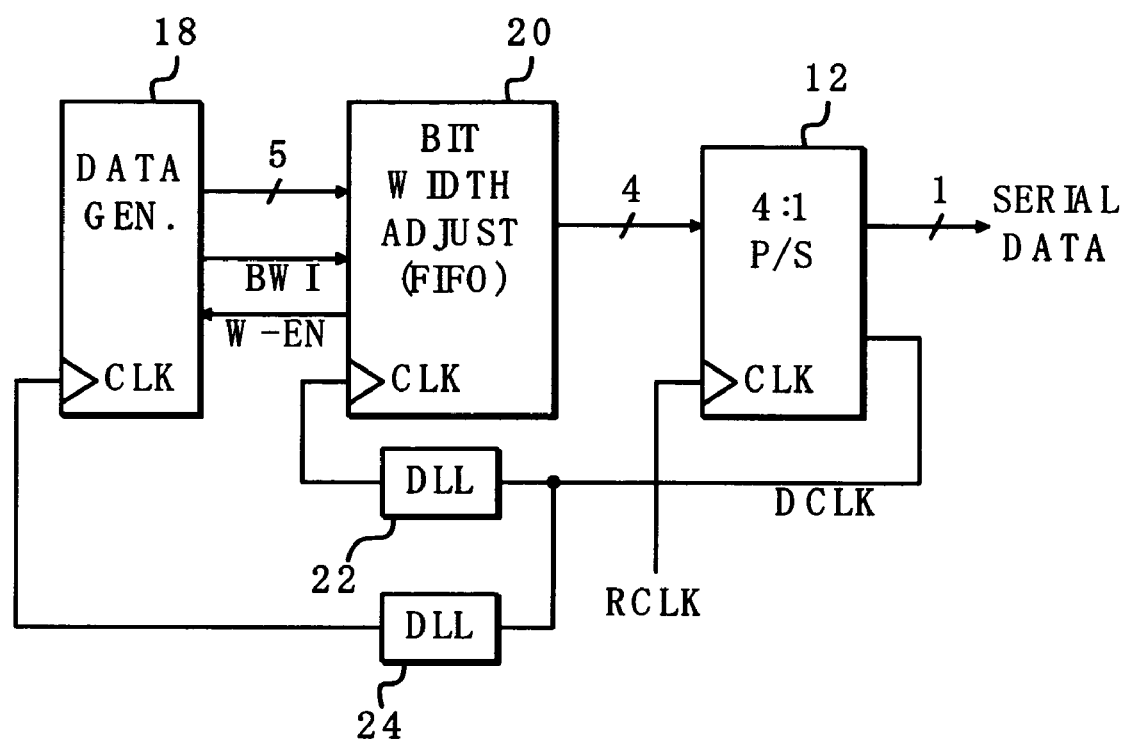
FIG. 5 is a block diagram of another preferred embodiment of a data generator according to the present invention with using DLLs.

As described, the bit width adjuster 20 always provides the second parallel data having a constant bit width despite of the effective bit width of the first parallel data by rearranging the first parallel data. This means that the frequency of the divided clock DCLK can be always constant, which realizes fast logic circuits by using the DLL etc. FIG. 5 shows one embodiment using DLLs 22 and 24 to adjust delay of the divided clock DCLK as if there were no delays wherein the frequency of the divided clock DCLK may be about 100 MHz. The arbitrary length of the fast serial data would be suitable for testing an electronic circuit. A plurality of the serial data produced by the present invention could be combined in parallel to generate fast parallel data used to produce an analog signal through an digital to analog converter.

What is claimed is:

1. A data generator comprising:
   a parallel data generator providing sets of first parallel data according to a first clock with each set of first parallel data having a bit width identifier wherein at least one set of the first parallel data has an effective bit width identified by the bit width identifier that is different from that of other sets of the first parallel data identified by their bit width identifier;
   a bit width adjustor receiving the sets of first parallel data and associated bit width identifiers according to the first clock with the bit width adjuster having a memory for storing the sets of the first parallel data with different bit widths and generating sets of second parallel data from the first parallel data having a constant bit width and a write enable signal wherein the write enable signal is de-asserted when the bit width identifier of a set of first parallel data is greater than the memory storage available in the bit width adjuster for that set of first parallel data; and
   a parallel-to-serial converter receiving the sets of second parallel data having the constant bit width and generating serial data according to a second clock that is faster than the first clock.

2. The data generator recited in claim 1 wherein the effective bit width of each set of the first parallel data may be selectively changed without changing the frequency of the first clock so that the one cycle of the serial data can be an arbitrary length.

3. The data generator recited in claim 1 wherein the first clock is produced by dividing the second clock.

4. The data generator recited in claim 1 wherein the memory storage of the bit width adjustor comprises a FIFO memory.

5. The data generator recited in claim 1 wherein the first clock is provided to at least one of the first parallel data providing means and the rearranging means through delayed lock loop (DLL).

* * * * *